United States Patent
Naitou

(10) Patent No.: US 10,018,677 B2
(45) Date of Patent: Jul. 10, 2018

(54) MOTOR CONTROLLER DETECTING ABNORMALITY OF POWER TRANSMISSION UNIT BETWEEN MAIN SPINDLE AND MOTOR

(71) Applicant: FANUC CORPORATION, Yamanashi (JP)

(72) Inventor: Genzou Naitou, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 145 days.

(21) Appl. No.: 14/524,390

(22) Filed: Oct. 27, 2014

(65) Prior Publication Data

US 2015/0115855 A1    Apr. 30, 2015

(30) Foreign Application Priority Data

Oct. 30, 2013    (JP) .................................. 2013-225719

(51) Int. Cl.
    *G01R 31/34*    (2006.01)
    *H02K 11/21*    (2016.01)
    *H02P 29/024*   (2016.01)

(52) U.S. Cl.
    CPC ........... *G01R 31/343* (2013.01); *H02K 11/21* (2016.01); *H02P 29/0241* (2016.02)

(58) Field of Classification Search
    CPC ............................. H04W 24/02; H04W 4/008
    USPC .......................................... 702/151; 307/123
    See application file for complete search history.

(56) References Cited

U.S. PATENT DOCUMENTS

| | | | | |
|---|---|---|---|---|
| 3,637,998 A | * | 1/1972 | Sylvester | ................ B21B 37/46 377/24 |
| 3,665,444 A | * | 5/1972 | Scott | ....................... G06M 7/04 250/223 B |
| 3,678,254 A | * | 7/1972 | Graff | ....................... G06M 7/04 235/98 C |
| 3,877,003 A | * | 4/1975 | Kawashima | ............ G01P 3/489 123/41.15 |

(Continued)

FOREIGN PATENT DOCUMENTS

CH    371938 A    9/1963
DE    3402429 C2    10/1987

(Continued)

OTHER PUBLICATIONS

English Machine Translation for German Publication No. 19506403, published Sep. 14, 1995, 67 pages.

(Continued)

*Primary Examiner* — Eduardo Colon Santana
*Assistant Examiner* — Devon Joseph
(74) *Attorney, Agent, or Firm* — Fredrikson & Byron, P.A.

(57) ABSTRACT

A motor controller includes a single-rotation signal detector detecting a single-rotation signal that indicates a single rotation of a main spindle, a rotation angle detector detecting a rotation angle of a motor every predetermined time, and a counter adding up the rotation angle. A value of the counter is reset when the single-rotation signal detector detects the single-rotation signal of the main spindle. The motor controller further includes a judgment unit judging that a power transmission unit has abnormality when a value of the rotation angle of the motor added up in the counter deviates from a predetermined range.

14 Claims, 5 Drawing Sheets

(56) References Cited

U.S. PATENT DOCUMENTS

| | | | | |
|---|---|---|---|---|
| 3,921,220 | A * | 11/1975 | Primosch | G11B 15/005<br>242/333.7 |
| 3,922,661 | A * | 11/1975 | Enabnit | B65G 43/02<br>198/810.02 |
| 3,989,989 | A * | 11/1976 | Mayer | B65G 43/00<br>198/502.4 |
| 4,263,578 | A * | 4/1981 | Fukuhara | G01P 1/103<br>307/123 |
| 4,464,654 | A * | 8/1984 | Klein | B65G 43/02<br>198/810.02 |
| 4,611,155 | A * | 9/1986 | Kurakake | G05B 19/231<br>318/603 |
| 4,849,917 | A * | 7/1989 | Danielsson | G01P 3/56<br>164/451 |
| 4,866,381 | A * | 9/1989 | Tatsuhiko | F02P 7/067<br>123/617 |
| 5,689,067 | A * | 11/1997 | Klein | F01L 1/02<br>123/90.17 |
| 6,064,519 | A * | 5/2000 | Otomo | G02B 21/242<br>359/383 |
| 6,675,642 | B1 * | 1/2004 | Hiller | H02P 9/04<br>73/114.59 |
| 6,715,602 | B1 * | 4/2004 | Gartland | B65G 43/02<br>198/502.1 |
| 7,209,862 | B2 * | 4/2007 | Taniguchi | G01D 5/24461<br>318/592 |
| 7,423,394 | B2 * | 9/2008 | Collins | H02P 6/16<br>318/400.01 |
| 7,533,571 | B2 * | 5/2009 | Ariav | A61B 5/02444<br>73/597 |
| 7,633,251 | B2 * | 12/2009 | Collins | H02P 6/16<br>318/400.14 |
| 7,740,128 | B2 * | 6/2010 | Wallace | B65G 43/02<br>198/618 |
| 7,830,138 | B2 * | 11/2010 | Wolf | G01D 5/145<br>324/207.22 |
| 8,033,546 | B2 * | 10/2011 | Takahashi | B41J 11/007<br>271/198 |
| 8,902,271 | B2 * | 12/2014 | Nagatoshi | B41J 2/471<br>347/224 |
| 2001/0008985 | A1 * | 7/2001 | Wada | G05D 1/0272<br>701/1 |
| 2003/0021613 | A1 * | 1/2003 | Koide | G03G 15/757<br>399/167 |
| 2003/0210932 | A1 * | 11/2003 | Koide | G03G 15/0131<br>399/302 |
| 2004/0131386 | A1 * | 7/2004 | Koide | G03G 15/757<br>399/167 |
| 2005/0171713 | A1 * | 8/2005 | Taniguchi | G01D 5/24461<br>702/69 |
| 2006/0087325 | A1 * | 4/2006 | Ariav | A61B 5/02444<br>324/637 |
| 2006/0166768 | A1 * | 7/2006 | Reuschel | F16H 61/66272<br>474/8 |
| 2007/0102264 | A1 * | 5/2007 | Wallace | B65G 43/02<br>198/618 |
| 2007/0126837 | A1 * | 6/2007 | Takahashi | B41J 11/007<br>347/104 |
| 2007/0159123 | A1 * | 7/2007 | Collins | H02P 6/16<br>318/400.1 |
| 2008/0169712 | A1 * | 7/2008 | Koyama | G01D 11/245<br>310/71 |
| 2008/0231262 | A1 * | 9/2008 | Wolf | G01D 5/145<br>324/207.2 |
| 2008/0257692 | A1 * | 10/2008 | Wallace | B65G 43/02<br>198/810.02 |
| 2008/0297083 | A1 * | 12/2008 | Collins | H02P 6/16<br>318/400.13 |
| 2010/0060222 | A1 * | 3/2010 | Kezobo | G01R 31/42<br>318/490 |
| 2010/0121604 | A1 * | 5/2010 | Vaisburd | G01C 9/00<br>702/154 |
| 2010/0131232 | A1 * | 5/2010 | Taylor | F02B 77/081<br>702/147 |
| 2010/0235138 | A1 * | 9/2010 | Staniewicz | G01M 13/023<br>702/151 |
| 2011/0246132 | A1 * | 10/2011 | Sato | B23Q 5/28<br>702/150 |
| 2014/0039694 | A1 * | 2/2014 | Yamaguchi | G05D 19/02<br>700/280 |
| 2014/0062366 | A1 * | 3/2014 | Yoshidomi | G01D 5/145<br>318/400.39 |

FOREIGN PATENT DOCUMENTS

| | | |
|---|---|---|
| DE | 3918071 A1 | 12/1990 |
| DE | 4133539 C1 | 5/1993 |
| DE | 19506403 A1 | 9/1995 |
| DE | 112009003699 T5 | 11/2012 |
| GB | 2454471 A | 5/2009 |
| JP | 61103750 A | 5/1986 |
| JP | 62-224766 A | 10/1987 |
| JP | 03120349 A | 5/1991 |
| JP | 03-120349 U | 12/1991 |
| JP | 11-190405 A | 7/1999 |
| JP | 2003-094289 A | 4/2003 |
| JP | 2010137310 A | 6/2010 |
| WO | 2007-143830 A1 | 12/2007 |

OTHER PUBLICATIONS

English Machine Translation for German Publication No. 4133539, published May 6, 1993, 15 pages.

English Machine Translation for German Publication No. 3918071, published Dec. 6, 1990, 6 pages.

English Machine Translation for German Publication No. 3402429, published Oct. 1, 1987, 10 pages.

English Machine Translation for Switzerland Publication No. 371938, published Sep. 15, 1963, 30 pages.

English Translation of Abstract for Japanese Publication No. JP03120349, published May 22, 1991, 1 page.

English Machine Translation for Japanese Publication No. 2010-137310 published Jun. 24, 2010, 24 pgs.

English Abstract for Japanese Publication No. 61-103750 published May 22, 1986, 1 pg.

English Machine Translation of Abstract for Japanese Publication No. 62-224766, published Oct. 2, 1987, 1 page.

Partial English Translation of Japanese Publication No. 03-120349, published Dec. 11, 1991, 1 page.

English Machine Translation of Japanese Publication No. 11-190405, published Jul. 13, 1999, 8 pages.

English Machine Translation of Japanese Publication No. 2003-094289, published Apr. 3, 2003, 8 pages.

* cited by examiner

MOTOR CONTROLLER DETECTING ABNORMALITY OF POWER TRANSMISSION UNIT BETWEEN MAIN SPINDLE AND MOTOR

BACKGROUND

1. Technical Field

The present invention relates to a motor controller that detects an abnormality in a power transmission unit arranged between a main spindle and a motor driving the main spindle of a machine tool for processing a workpiece.

2. Related Art

Machine tools with a tool attached to a main spindle are widely used. In such machine tools, driving power from a motor is transmitted to the main spindle through a power transmission unit and rotation of the main spindle allows the tool to process a workpiece.

The power transmission unit includes, for example, a belt and pulleys. Deterioration of the belt over time causes considerable slipping due to looseness, breakage of the belt, etc., and therefore the driving power may not be transmitted appropriately. In order to detect such conditions as soon as possible or prevent the problems in advance, methods have conventionally been proposed that judge the abnormality of a power transmission unit.

For example, in Japanese Unexamined Patent Publication No. S61-103750, a non-contact-type speed sensor disposed near a belt detects the speed of a main spindle, and when a difference between the speed of the main spindle and the speed of a motor exceeds an allowance, it is judged that the power transmission unit has an abnormality.

In addition, Japanese Unexamined Patent Publication No. 2010-137310 discloses a first judgment unit judging that a belt has abnormality when a load of a motor is in a predetermined range and a second judgment unit operated when the first judgment unit judges the abnormality in the belt. The second judgment unit detects the state of another component different from the motor and thereby judges that there is abnormality in the belt. The first judgment unit, for example, monitors an electric current flowing through the motor or includes a torque meter. The second judgment unit includes, for example, a deflection sensor for monitoring the deflection of a tool attached to a main spindle.

However, the technique of the former Patent Literature (No. 61-103750) requires an additional speed sensor, and the technique of the latter Patent Literature (No. 2010-137310) requires a torque meter, a deflection sensor, etc. The addition of a speed sensor, etc., results in an increase in cost.

The present invention has been accomplished in view of such circumstances, and it is an object of the invention to provide a motor controller capable of judging abnormality of a power transmission unit without adding a speed sensor, a torque meter, or the like.

SUMMARY OF THE INVENTION

In order to achieve the object described above, according to a first aspect of the present invention, there is provided a motor controller detecting abnormality of a power transmission unit that connects a motor and a main spindle of a machine tool and has a known speed reduction ratio, the motor controller including a single-rotation signal detector detecting a single-rotation signal that indicates a single rotation of the main spindle; a rotation angle detector detecting a rotation angle of the motor every predetermined time; a counter adding up the rotation angle detected by the rotation angle detector every predetermined time, a value of the counter being reset when the single-rotation signal detector detects the single-rotation signal of the main spindle; and a judgment unit judging that the power transmission unit has abnormality when the value of the rotation angle of the motor added up in the counter deviates from a predetermined range.

According to a second aspect of the invention, in the invention of the first aspect, a mechanism is provided that changes the speed reduction ratio of the power transmission unit, and when the mechanism changes the speed reduction ratio of the power transmission unit, the predetermined range is changed according to the change of the speed reduction ratio.

According to a third aspect of the invention, in the first or the second aspect, the predetermined range is set as an upper limit value of the rotation angle of the motor, and when the value of the rotation angle of the motor added up in the counter exceeds the upper limit value, the judgment unit judges that the power transmission unit has abnormality.

According to a fourth aspect of the invention, in the first or the second aspect, the predetermined range is set as a range between an upper limit value and a lower limit value of the rotation angle of the motor, when the value of the rotation angle of the motor added up in the counter exceeds the upper limit value during acceleration or constant-speed driving of the motor, the judgment unit judges that the power transmission unit has abnormality, and when the value of the rotation angle of the motor added up in the counter at the time of detection of the single-rotation signal of the main spindle falls down the lower limit value during deceleration or stop of the motor, the judgment unit judges that the power transmission unit has abnormality.

According to a fifth aspect of the invention, in any one of the first to the fourth aspects, the power transmission unit includes a belt and pulleys for winding the belt therearound.

According to a sixth aspect of the invention, in any one of the first to the fifth aspects, the motor controller further includes an alarm unit generating an alarm when the judgment unit judges that the power transmission unit has abnormality.

According to a seventh aspect of the invention, in the sixth aspect, a zero speed command is further given to the motor to stop the motor when the judgment unit judges that the power transmission unit has abnormality.

According to an eighth aspect of the invention, in the sixth aspect, excitation of the motor is further interrupted when the judgment unit judges that the power transmission unit has abnormality.

DETAILED DESCRIPTION

Figure 1:
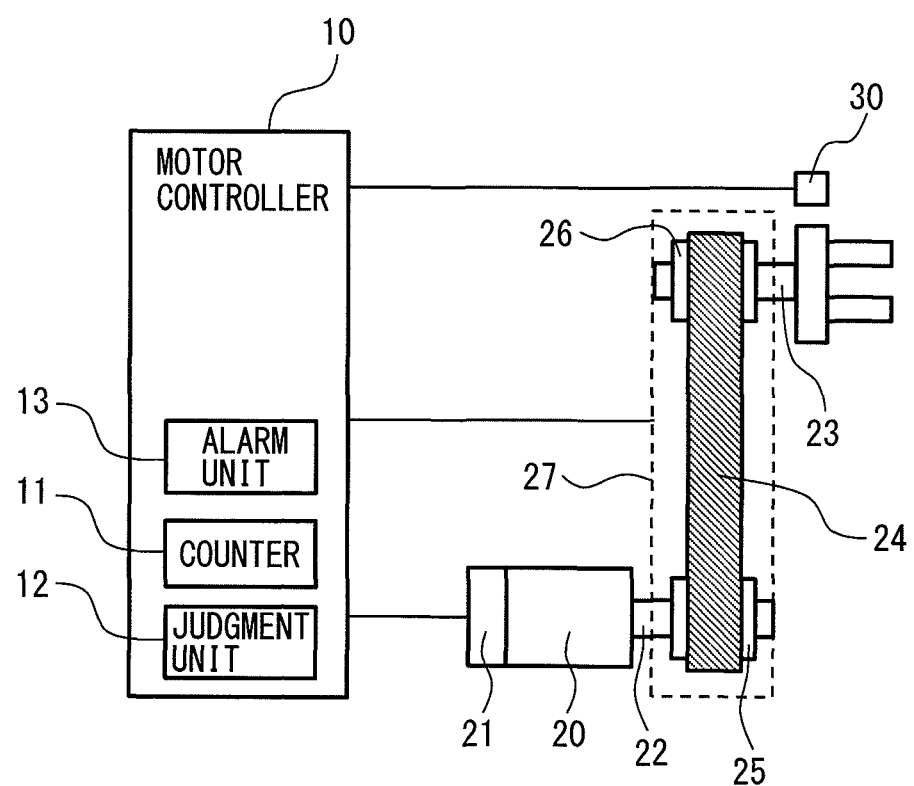
FIG. 1 is a block diagram of a motor controller according to an embodiment of the present invention.

An embodiment of the present invention will be described below with reference to the accompanying drawings. The same reference numerals in the drawings below denote the same members. For easier understanding, the drawings are changed in scale as needed.

FIG. 1 is a block diagram of a motor controller according to an embodiment of the present invention. A motor controller 10 is a numerical controller and controls a drive motor 20 of a machine tool. As depicted in FIG. 1, a pulley 25 is attached to an output shaft 22 of the drive motor 20. In addition, another pulley 26 is attached to a main spindle 23 of the machine tool.

As can be seen from FIG. 1, the pulleys 25 and 26 are connected by a belt 24. The belt 24 and the pulleys 25 and 26 may be hereinafter referred together to as "power transmission unit 27". When the drive motor 20 is driven, the rotation of the output shaft 22 is transmitted to the main spindle 23 of the machine tool through the power transmission unit 27. Additionally, the power transmission unit 27 may include a speed reducer or may be a speed reducer. In that case, a speed reduction ratio of the speed reducer is input to the motor controller 10. In the present invention, the speed reduction ratio of the power transmission unit 27 is known.

As depicted in FIG. 1, an encoder 21 is attached to the drive motor 20 and detects a rotation angle of the output shaft 22 of the drive motor 20 every predetermined time. In addition, a single-rotation signal detector 30 is arranged near the main spindle 23 of the machine tool. The single-rotation signal detector 30 detects a single-rotation signal that indicates a single rotation of the main spindle 23. In the present invention, the speed reduction ratio of the power transmission unit 27 is known, so that an ideal rotation angle of the drive motor 20 per rotation of the main spindle 23 is automatically obtained.

Additionally, as depicted on the left side of FIG. 1, the motor controller 10 includes a counter 11 and a judgment unit 12. The counter 11 sequentially adds up a rotation angle detected by the encoder 21. Then, the counter 11 stores a final added-up value obtained when the single-rotation signal detector 30 detects a single-rotation signal, and then is reset. The judgment unit 12 judges whether or not the power transmission unit 27 has abnormality by a method described below. The motor controller 10 further includes an alarm unit 13 outputting an alarm when abnormality has occurred in the power transmission unit 27.

Figure 2:
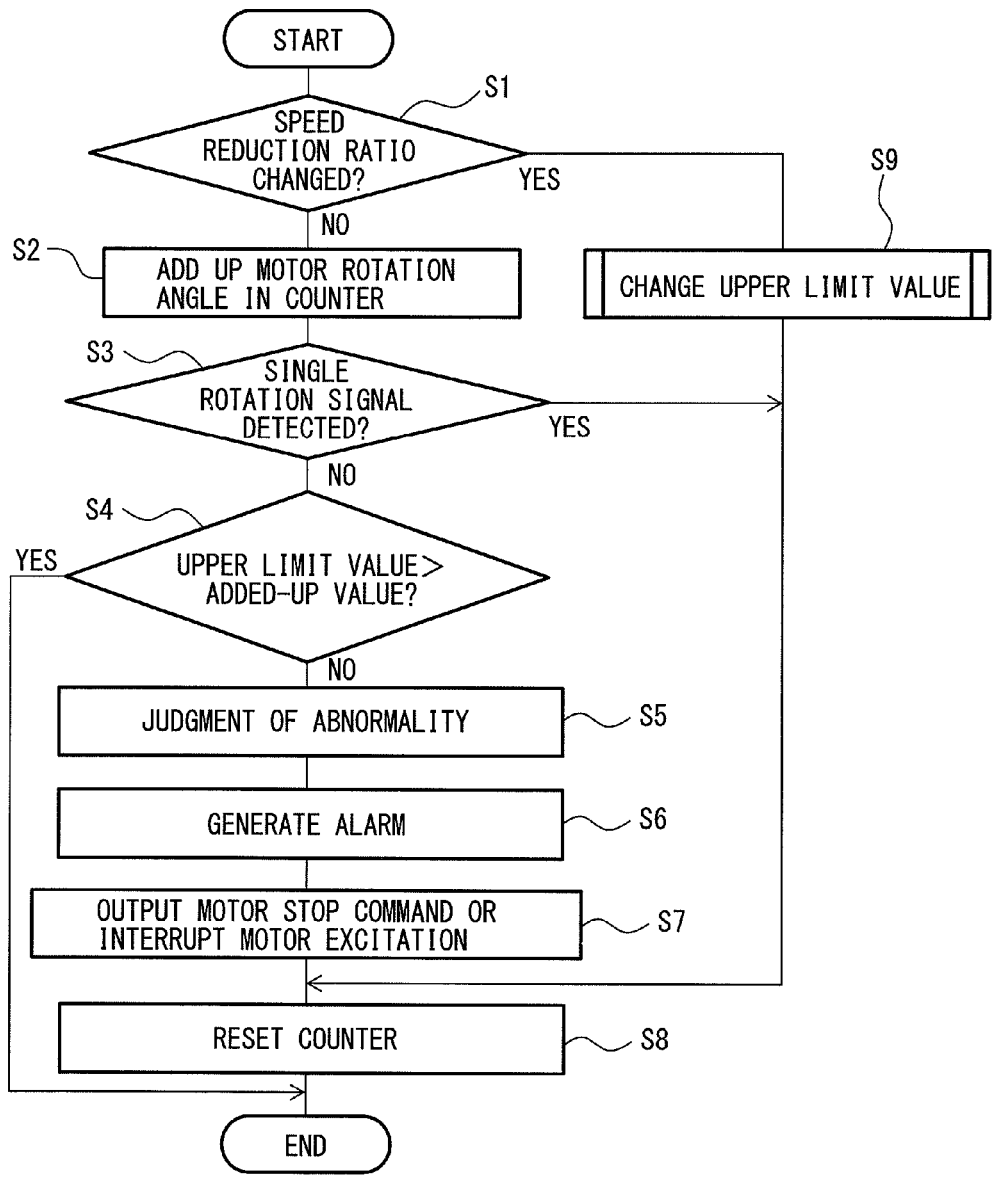
FIG. 2 is a flowchart depicting an operation of the motor controller according to the embodiment of the invention.

FIG. 2 is a flowchart depicting an operation of the motor controller according to the embodiment of the present invention. A description will be given below of the operation of the motor controller 10 according to the embodiment of the invention with reference to FIG. 2. The operation illustrated in FIG. 2 is repeated every predetermined sampling cycle.

In FIG. 2, the judgment unit 12 has only an upper limit value as a limit value of the rotation angle of the motor, and the power transmission unit 27 includes a speed reducer. Then, in step S1 of FIG. 2, it is judged whether the speed reduction ratio of the speed reducer is changed or not. The judgment may be executed by the judgment unit 12. The processing proceeds to step S9 when the speed reduction ratio is changed, and the upper limit value is changed as described below. When the speed reduction ratio is not changed, the processing proceeds to step S2 without changing the upper limit value. The upper limit value is an upper limit value of the rotation angle of the drive motor 20 calculated in advance based on experimentation results and the like and used for judging the abnormality of the power transmission unit 27, as described below.

Figure 3:
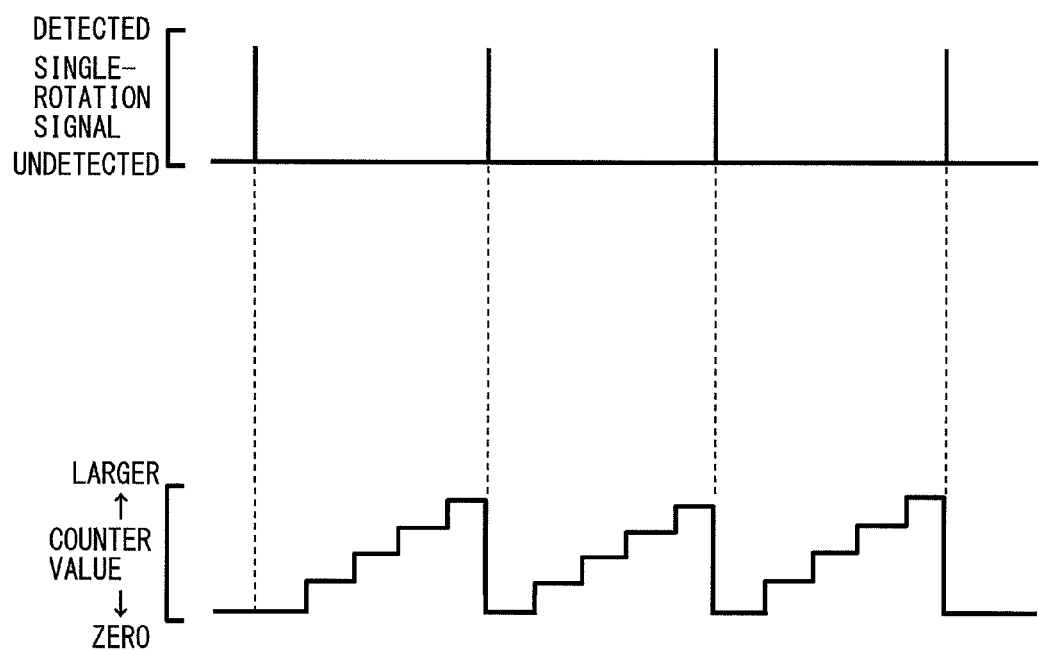
FIG. 3 is a time chart of single-rotation signals and counter values.

In step S2, the encoder 21 detects the rotation angle of the drive motor 20 every predetermined time. FIG. 3 is a time chart of single-rotation signals and counter values. As illustrated in FIG. 3, the rotation angle detected by the encoder 21 every predetermined time is sequentially added up as a counter value in the counter 11.

Then, in step S3 of FIG. 2, it is judged whether or not the single-rotation signal detector 30 detected a single-rotation signal after starting to add up the counter value. When the single-rotation signal is detected, the processing proceeds to step S8 and the counter value of the counter 11 is reset (see FIG. 3). On the other hand, when the single-rotation signal is undetected, the processing proceeds to step S4.

In step S4, the judgment unit 12 judges whether or not the counter value (an added-up value) is greater than the upper limit value mentioned above. A counter value at a time of detection of a single-rotation signal corresponds to a rotation angle of the drive motor 20 for causing a single rotation of the main spindle 23 from a certain reference position. As can be seen from FIG. 3, the reference position is a position of the drive motor 20 at a time of detection of a last single-rotation signal.

When the counter value (the added-up value) at the time of detection of the single-rotation signal is in a predetermined range, it is judged that the power transmission unit 27 has no abnormality and the processing is ended. Meanwhile, when the counter value is not in the predetermined range, it is judged in step S5 that there is abnormality in the power transmission unit 27.

The abnormality of the power transmission unit 27 may be, for example, slipping of the belt 24 or breakage thereof. Such an abnormal state delays the detection of the single-rotation signal of the main spindle 23 and, accordingly, the counter value of rotation angles of the drive motor 20 becomes greater than when there is no abnormality in the power transmission unit 27. In other words, when the counter value exceeds the predetermined range, it can be judged that the power transmission unit 27 has an abnormality.

The alarm unit 13 outputs an alarm in step S6 when abnormality has occurred in the power transmission unit 27. The alarm may be either audible or visual. Alternatively, both of an audible alarm and a visual alarm may be output. The alarm alerts an operator to the abnormal state, so that the operator can recognize the occurrence of an abnormality in the power transmission unit 27.

Then, in step S7, the motor controller 10 outputs a stop command (a zero speed command) to the drive motor 20. Alternatively, excitation of the drive motor 20 may be interrupted. When the power transmission unit 27 has an abnormality, processing of a workpiece becomes unfavorable, resulting in the production of a defective product from the workpiece. However, since the present invention stops the main spindle 23, the production of a defective product from a workpiece can be prevented. Additionally, the invention can also suppress increase in the abnormality of the power transmission unit 27. Finally, in step S8, the counter 11 is reset and the processing is ended.

Therefore, the present invention can detect an abnormality in the power transmission unit 27 by using only a single-rotation signal from the single-rotation signal detector 30 and a rotation angle from the encoder 21. The encoder 21 is usually attached to the drive motor 20. Thus, the invention can detect abnormality of the power transmission unit 27 by addition only the single-rotation signal detector 30, but without adding a speed sensor, a torque meter, etc. Therefore, it will be understood that the invention can eliminate cost for a speed sensor, a torque meter, or the like.

Figure 4:
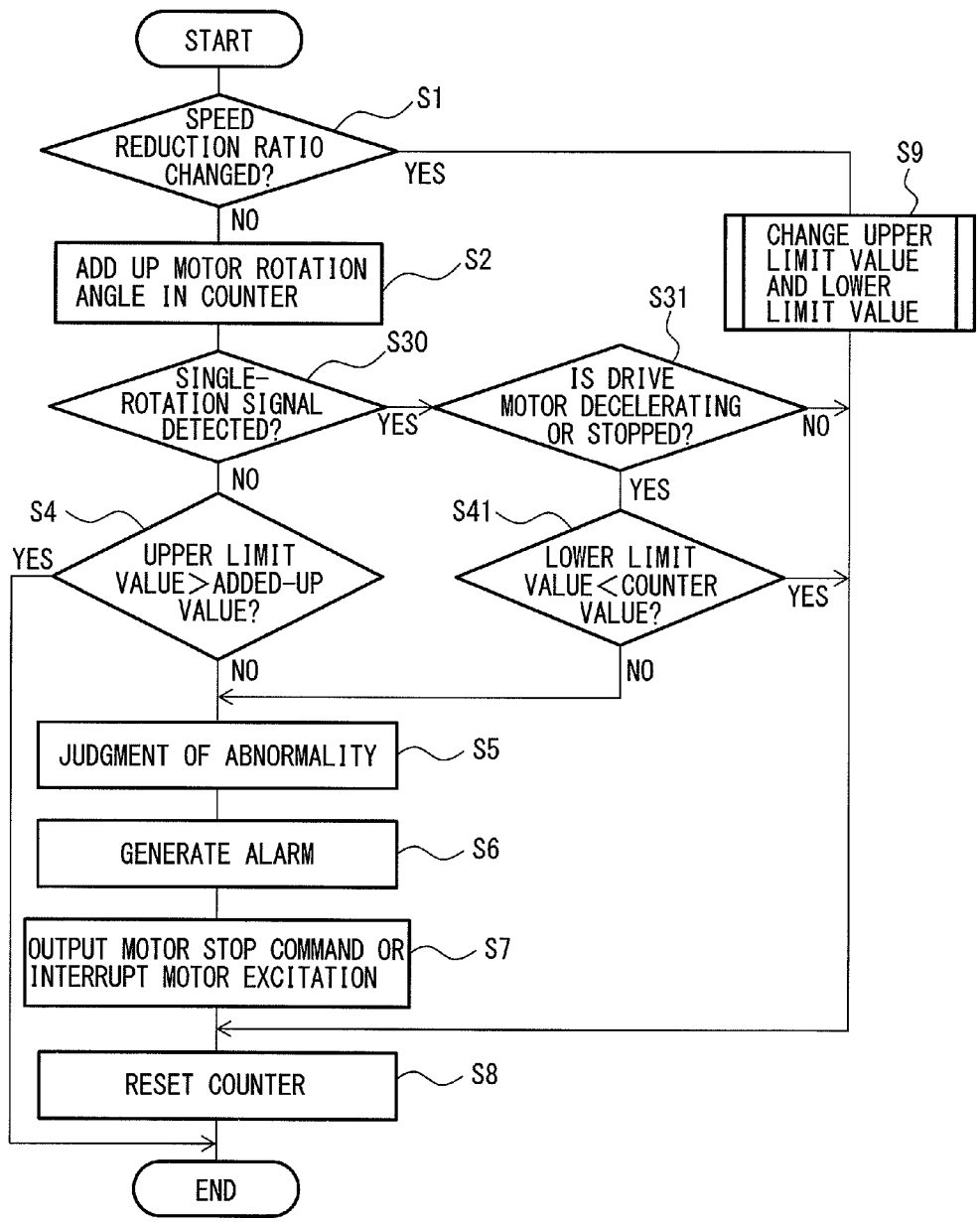
FIG. 4 is a flowchart depicting another operation of the motor controller according to the embodiment of the invention.

FIG. 4 is a flowchart depicting another operation of the motor controller according to the embodiment of the present invention. Steps S1 to S2 and steps S4 to S9 depicted in FIG. 4 are the same as depicted in FIG. 2, and thus explanations thereof are omitted.

At the time of detection of the single-rotation signal, it is judged in step S31 of FIG. 4 whether the drive motor 20 is "decelerating or stopped" or not. The judgment may be made based on the rotation angle of the motor 20 detected by the encoder 21 every predetermined time.

Then, the processing proceeds to step S41 when the drive motor 20 is decelerating or stopped. When the counter value is judged to be smaller than a lower limit value of the rotation angle of the motor in step S41, the processing proceeds to step S5 and it is then judged that abnormality has occurred in the power transmission unit 27. Counter values not smaller than the lower limit value indicate that there is no abnormality in the power transmission unit 27. Accordingly, the counter 11 is reset in step S8 and the processing is ended.

The occurrence of abnormality in the power transmission unit 27 during deceleration or stop of the drive motor 20 reduces the counter value of rotation angles of the drive motor 20 between two single-rotation signals compared to when there is no abnormality in the power transmission unit 27. In other words, when the counter value is smaller than the lower limit value, it can be judged that an abnormality has occurred in the power transmission unit 27.

In addition, when it is judged in step S31 that the drive motor 20 is decelerating or stopped, the counter 11 is reset in step S8 and the processing is ended.

The upper and the lower limit values of the rotation angle are determined as follows. In one example, an added-up value of a rotation angle per rotation of the drive motor 20 is 300. In addition, a ratio of the number of rotations of the drive motor 20 to the number of rotations of the main spindle 23 is 2:1. In other words, the speed reduction ratio is ½. In such a case, a theoretical value of an added-up value of the rotation angle at the time of detection of a single-rotation signal of the main spindle 23 is 600 (=300×2).

Then, the operator sets an allowable range with respect to the theoretical value. For example, when a value twice the theoretical value is set as an allowable value of the upper limit value, the upper limit value is 1200 (=600×2). In addition, when a value one-third as large as the theoretical value is set as an allowable value of the lower limit value, the lower limit value is 200 (=600×⅓). In such a case, it is judged in step S4 and S41 of FIG. 4 that abnormality has occurred in the power transmission unit 27, when the added-up value is smaller than 200 or greater than 1200. In this way, the upper and the lower limit values are determined according to the allowable range set by the operator.

Figure 5:
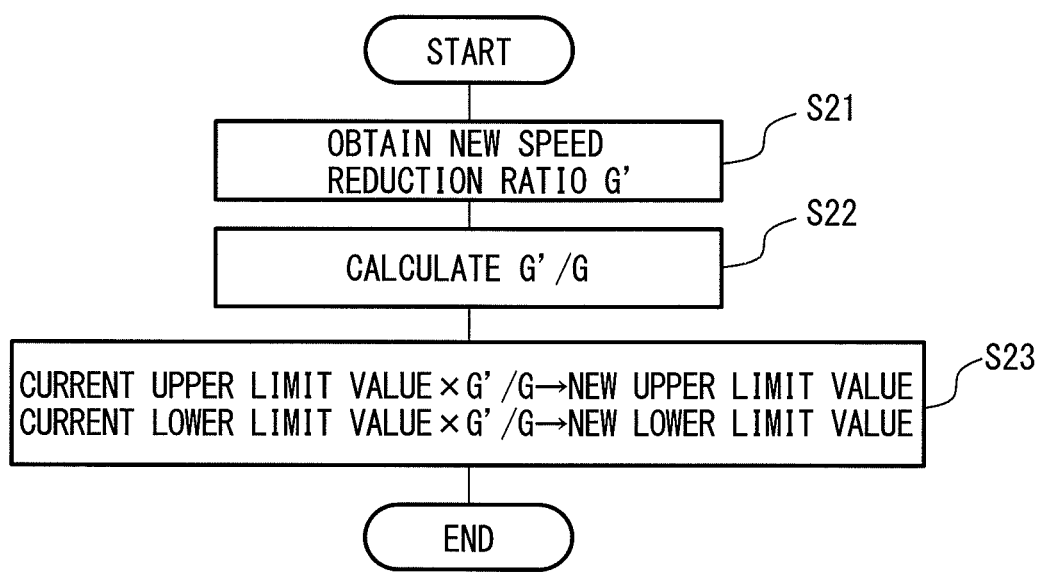
FIG. 5 is a flowchart depicting processing for changing an upper limit value and a lower limit value.

In addition, when the speed reduction ratio is changed in step S1 depicted in FIG. 4, the upper and the lower limit values are changed in step S9 as described below. FIG. 5 is a flowchart indicating processing for changing the upper and lower limit values. A new speed reduction ratio G' is obtained in step S21 depicted in FIG. 5. Then, in step S22, a ratio of the new speed reduction ratio G' to a current speed reduction ratio G: G'/G is obtained. Finally, in step S23, the current upper and lower limit values are multiplied by the ratio G'/G to calculate a new upper limit value and a new lower limit value, respectively.

The new upper limit value and the new lower limit value are automatically set as threshold values for judging whether or not there is abnormality in the power transmission unit 27. Accordingly, even when the speed reduction ratio of the power transmission unit 27 is changed, the motor controller according to the embodiment of the invention allows the upper and lower limit values to be appropriately changed according to the change of the speed reduction ratio, and thus it can similarly be judged whether or not an abnormality has occurred in the power transmission unit 27.

Advantageous Effects of the Invention

In the first aspect of the invention, the presence or absence of abnormality in the power transmission unit can be judged by arranging only the single-rotation signal detector near the main spindle without adding a speed sensor, a torque meter, since the rotation angle detector is usually attached to the motor. Therefore, cost required for a speed sensor, a torque meter, etc., can be eliminated.

In the second aspect of the invention, the predetermined range can be appropriately changed according to the change of the speed reduction ratio, even when the speed reduction ratio of the power transmission unit is changed.

In the third and the fourth aspects of the invention, there can be obtained the similar advantageous effect as that in the first aspect.

In the fifth aspect of the invention, the presence or absence of abnormality in the power transmission unit can be easily judged, even when the power transmission unit has a relatively simple structure.

In the sixth aspect of the invention, the operator can be alerted when abnormality has occurred in the power transmission unit.

In the seventh and the eighth aspects of the invention, stopping the main spindle of the machine tool can prevent the production of a defective product from a workpiece.

Although the present invention has been described with reference to a typical embodiment of the invention, those skilled in the art would understand that the above-described changes, other various changes, omissions, and additions can be made without departing from the scope of the invention.

What is claimed is:

1. A motor controller detecting an abnormality in a power transmission unit that connects a motor and a main spindle of a machine tool and has a known speed reduction ratio, the motor controller comprising:
   a single-rotation signal detector detecting a single-rotation signal that indicates a single rotation of the main spindle;
   a rotation angle detector detecting a rotation angle of the motor every predetermined time;
   a counter adding up the rotation angle detected by the rotation angle detector every predetermined time, a value of the counter being reset when the single-rotation signal detector detects the single-rotation signal of the main spindle, the counter outputting a counter value; and
   a judgment unit receiving only the counter value as an input and judging that a belt in the power transmission unit has an abnormality when a value of the rotation angle of the motor added up in the counter is greater than a predetermined value before the counter is reset by the single-rotation signal detector.

2. The motor controller according to claim 1, wherein a mechanism is provided that changes the speed reduction ratio of the power transmission unit, and when the mechanism changes the speed reduction ratio of the power transmission unit, the predetermined range is changed according to the change of the speed reduction ratio.

3. The motor controller according to claim 1, wherein the predetermined range is set as an upper limit value of the rotation angle of the motor, and when the added-up value of the rotation angle of the motor exceeds the upper limit value, the judgment unit judges that the power transmission unit has an abnormality.

4. The motor controller according to claim 2, wherein the predetermined range is set as an upper limit value of the rotation angle of the motor, and when the added-up value of the rotation angle of the motor exceeds the upper limit value, the judgment unit judges that the power transmission unit has an abnormality.

5. The motor controller according to claim 1, wherein the predetermined range is set as a range between an upper limit value and a lower limit value of the rotation angle of the motor, when the added-up value of the rotation angle of the motor exceeds the upper limit value during acceleration or constant-speed driving of the motor, the judgment unit judges that the power transmission unit has an abnormality, and when the value of the rotation angle of the motor added up in the counter at the time of detection of the single-rotation signal of the main spindle falls down the lower limit value during deceleration or stop of the motor, the judgment unit judges that the power transmission unit has an abnormality.

6. The motor controller according to claim 2, wherein the predetermined range is set as a range between an upper limit value and a lower limit value of the rotation angle of the motor, when the added-up value of the rotation angle of the motor exceeds the upper limit value during acceleration or constant-speed driving of the motor, the judgment unit judges that the power transmission unit has an abnormality, and when the value of the rotation angle of the motor added up in the counter at the time of detection of the single-rotation signal of the main spindle falls to the lower limit value during deceleration or stop of the motor, the judgment unit judges that the power transmission unit has an abnormality.

7. The motor controller according to claim 1, wherein the power transmission unit includes a belt and pulleys for winding the belt therearound.

8. The motor controller according to claim 2, wherein the power transmission unit includes a belt and pulleys for winding the belt therearound.

9. The motor controller according to claim 1, further comprising an alarm unit generating an alarm when the judgment unit judges that the power transmission unit has an abnormality.

10. The motor controller according to claim 2, further comprising an alarm unit generating an alarm when the judgment unit judges that the power transmission unit has an abnormality.

11. The motor controller according to claim 9, wherein, a zero speed command is further given to the motor to stop the motor when the judgment unit judges that the power transmission unit has an abnormality.

12. The motor controller according to claim 10, wherein, a zero speed command is further given to the motor to stop the motor when the judgment unit judges that the power transmission unit has an abnormality.

13. The motor controller according to claim 9, wherein, excitation of the motor is interrupted when the judgment unit judges that the power transmission unit has an abnormality.

14. The motor controller according to claim 10, wherein, excitation of the motor is interrupted when the judgment unit judges that the power transmission unit has an abnormality.

* * * * *